(12) United States Patent
Wang et al.

(10) Patent No.: US 12,557,562 B2
(45) Date of Patent: Feb. 17, 2026

(54) RRAM AND FABRICATING METHOD OF THE SAME

(71) Applicant: UNITED MICROELECTRONICS CORP., Hsin-Chu (TW)

(72) Inventors: Wen-Jen Wang, Tainan (TW); Yu-Huan Yeh, Hsinchu (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 397 days.

(21) Appl. No.: 18/224,054

(22) Filed: Jul. 19, 2023

(65) Prior Publication Data
US 2024/0431219 A1   Dec. 26, 2024

(30) Foreign Application Priority Data
Jun. 21, 2023 (CN) .......................... 202310742341.5

(51) Int. Cl.
*H10N 70/00* (2023.01)
*H10B 63/00* (2023.01)
*H10N 70/20* (2023.01)

(52) U.S. Cl.
CPC ......... *H10N 70/8265* (2023.02); *H10B 63/80* (2023.02); *H10N 70/011* (2023.02); *H10N 70/24* (2023.02); *H10N 70/8833* (2023.02)

(58) Field of Classification Search
CPC ................................ H10N 70/00; H10B 63/00
See application file for complete search history.

(56) References Cited

U.S. PATENT DOCUMENTS 9,099,647 B2   8/2015   Liao
2018/0331282 A1   11/2018   Zhu

*Primary Examiner* — Marvin Payen
(74) *Attorney, Agent, or Firm* — Winston Hsu

(57) ABSTRACT

An RRAM includes a bottom electrode, a resistive switching layer, a top electrode and a cap layer stacked from bottom to top. The cap layer includes a top surface. A first spacer contacts a first sidewall of the bottom electrode, and a second sidewall of the resistive switching layer. A second spacer contacts the first spacer and contacts a third spacer of the top electrode. A thickness of the first spacer is greater of a thickness of the second spacer. The first spacer and the second spacer do not cover the topmost surface of the cap layer.

18 Claims, 5 Drawing Sheets

RRAM AND FABRICATING METHOD OF THE SAME

BACKGROUND OF THE INVENTION

1. Field of the Invention

The invention relates to a resistive random access memory (RRAM) with two stacked spacers and a manufacturing method thereof, and particularly to a manufacturing method of an RRAM with two stacked spacers to block oxygen atoms.

2. Description of the Prior Art

Nonvolatile memory is capable of retaining the stored information even when unpowered. Non-volatile memory may be used for secondary storage or long-term persistent storage. RRAM technology has been gradually recognized as having exhibited those semiconductor memory advantages.

RRAM cells are non-volatile memory cells that store information by changes in electric resistance, not by changes in charge capacity. In general, the resistance of the resistive layer varies according to an applied voltage. An RRAM cell can be in a plurality of states in which the electric resistances are different. Each different state may represent digital information. The state can be changed by applying a predetermined voltage or current between the electrodes. A state is maintained as long as a predetermined operation is not performed.

With the growth of electronic data, the demand of higher memory capacity, longer lifespan and faster read and write speed of RRAM has increased significantly. In order to achieve high performance operation, it is necessary to increase the retention and endurance of RRAM.

SUMMARY OF THE INVENTION

In light of the above, the present invention provides an RRAM with two stacked spacers to increase the reliability of the RRAM.

According to a preferred embodiment of the present invention, an RRAM includes a bottom electrode, a resistive switching layer, a top electrode and a cap layer stacked from bottom to top. The cap layer includes a top surface and two fourth sidewalls, and an edge of the top surface connects to each of the two fourth sidewalls. A first spacer contacts a first sidewall of the bottom electrode, and a second sidewall of the resistive switching layer. A second spacer contacts the first spacer and contacts a third sidewall of the top electrode, wherein a thickness of the first spacer is greater than a thickness of the second spacer and the first spacer and the second spacer do not cover the top surface of the cap layer.

According to another preferred embodiment of the present invention, a fabricating method of an RRAM includes forming a bottom electrode, a resistive switching layer, a top electrode and a cap layer stacked from bottom to top, wherein the cap layer includes a top surface and two fourth sidewalls, and an edge of the top surface connects to each of the two fourth sidewalls. Next, a first spacer is formed to contact a first sidewall of the bottom electrode, and a second sidewall of the resistive switching layer. Thereafter, a second spacer is formed to contact the first spacer and contact a third sidewall of the top electrode, wherein a thickness of the first spacer is greater than a thickness of the second spacer and the first spacer and the second spacer do not cover the top surface of the cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of an RRAM according to a preferred embodiment of the present invention; wherein:

FIG. 1 depicts a substrate including a memory region and a logic device region thereon;

FIG. 2 is a fabricating stage in continuous from FIG. 1;

FIG. 3 is a fabricating stage in continuous from FIG. 2;

FIG. 4 is a fabricating stage in continuous from FIG. 3;

FIG. 5 is a fabricating stage in continuous from FIG. 4; and

FIG. 6 is a fabricating stage in continuous from FIG. 5.

DETAILED DESCRIPTION

FIG. 1 to FIG. 6 depict a fabricating method of an RRAM according to a preferred embodiment of the present invention.

Figure 1:
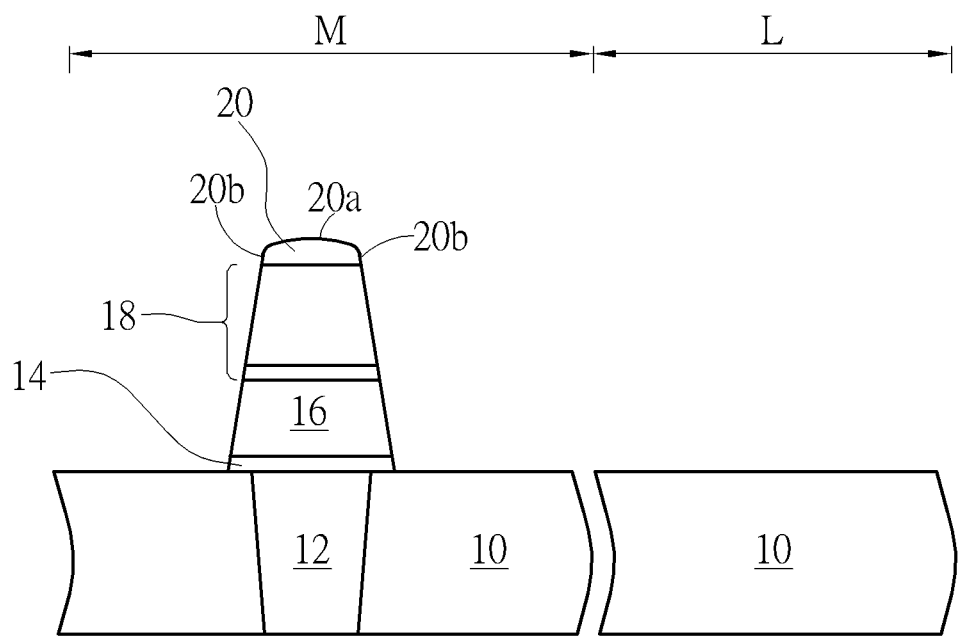

As shown in FIG. 1, a substrate 10 is provided. The substrate 10 includes a memory region M and a logic device region L. A conductive line 12 is embedded within the memory region M of the substrate 10. Then, a bottom electrode material layer, a resistive switching material layer, a top electrode material layer and a cap material layer are formed from bottom to top to cover the memory region M and the logic device region L.

Later, the bottom electrode material layer, the resistive switching material layer, the top electrode material layer and the cap material layer are patterned to form a bottom electrode 14, a resistive switching layer 16, a top electrode 18 and a cap layer 20 staked from bottom to top in the memory region M and the bottom electrode material layer, the resistive switching material layer, the top electrode material layer and the cap material layer within the logic device region L are completely removed. The cap layer 20 includes a top surface 20a and two fourth sidewalls 20b, and an edge of the top surface 20a connects to each of the two fourth sidewalls 20b. The bottom electrode 14 directly contacts the conductive line 12. The conductive line 12 may include copper, aluminum, tungsten or other conductive materials.

Figure 2:
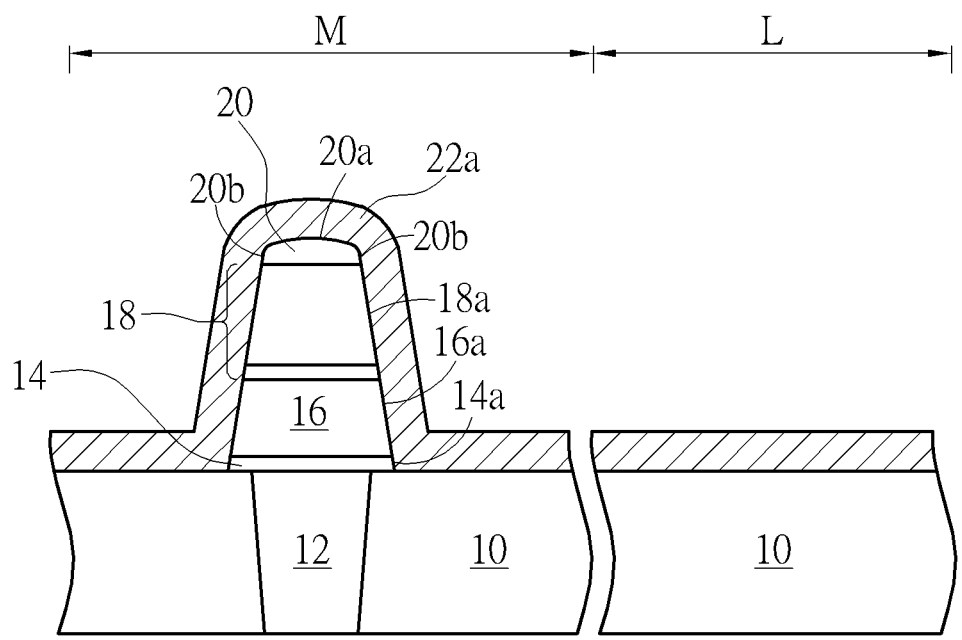
Figure 3:
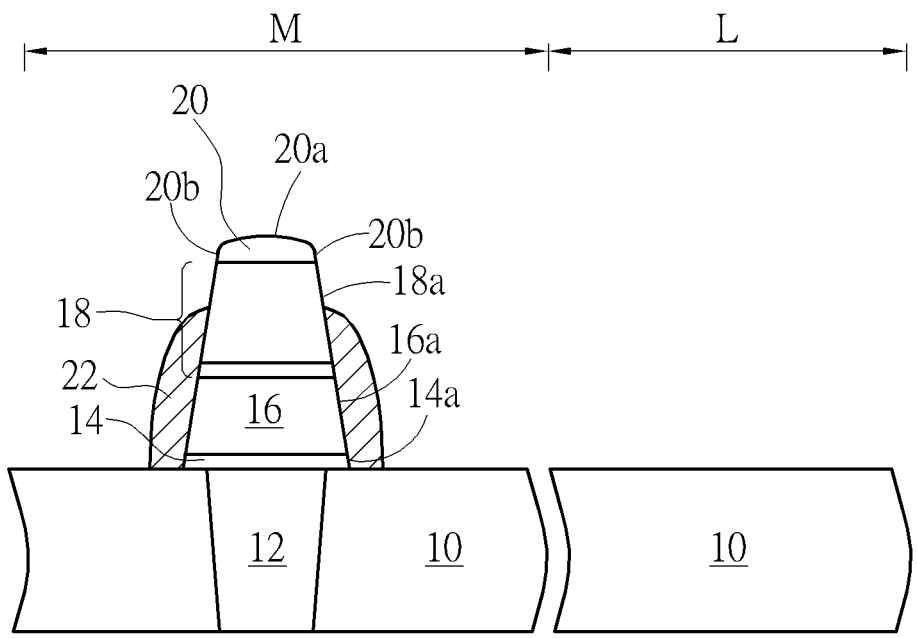

As shown in FIG. 2 and FIG. 3, a first spacer material layer 22a is formed to conformally cover the bottom electrode 14, the resistive switching layer 16, the top electrode 18, the cap layer 20, the substrate 10 of the memory region M and the substrate 10 of the logic device region L. Later, the first spacer material layer 22a is etched to remove the first spacer material layer 22a on the top surface 20a of the cap layer 20, on the fourth sidewalls 20b and on part of the third sidewall 18a of the top electrode 18 to form a first spacer 22 respectively at two sides of the bottom electrode 14, the resistive switching layer 16 and the top electrode 18.

When forming the first spacer 22, the first spacer material layer 22a within the logic device region L is also removed. The first spacer 22 is preferably silicon nitride. The first spacer 22 preferably directly contacts part of the third sidewall 18a of the top electrode 18, an entirety of the first sidewall 14a of the bottom electrode 14 and an entirety of the second sidewall 16a of the resistive switching layer 16. Furthermore, the first spacer 22 does not contact the fourth sidewalls 20b and the top surface 20a of the cap layer 20.

Figure 4:
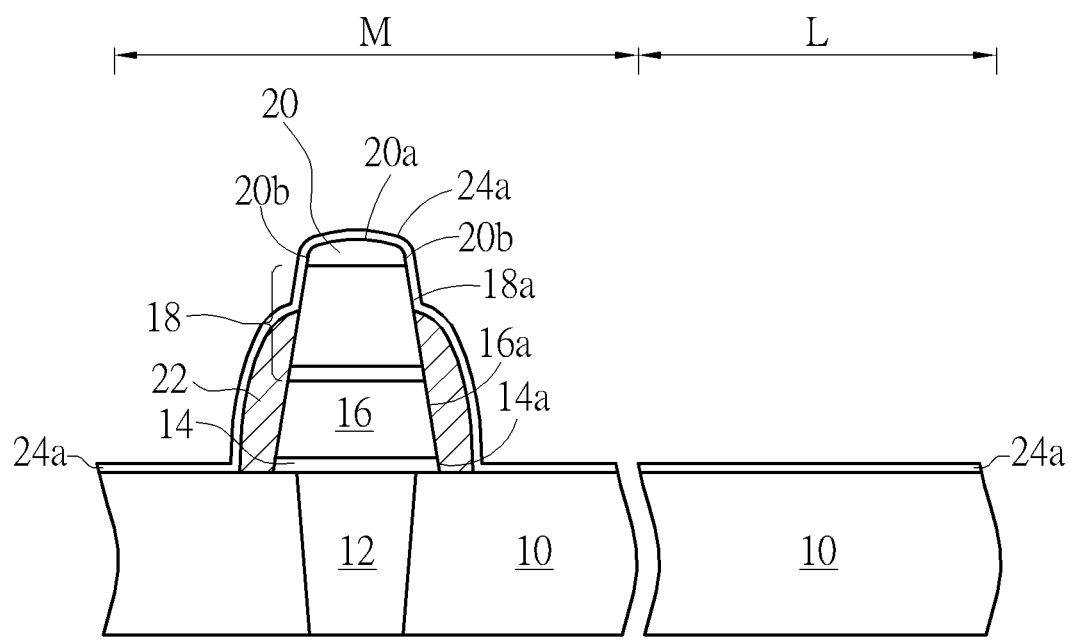
Figure 5:
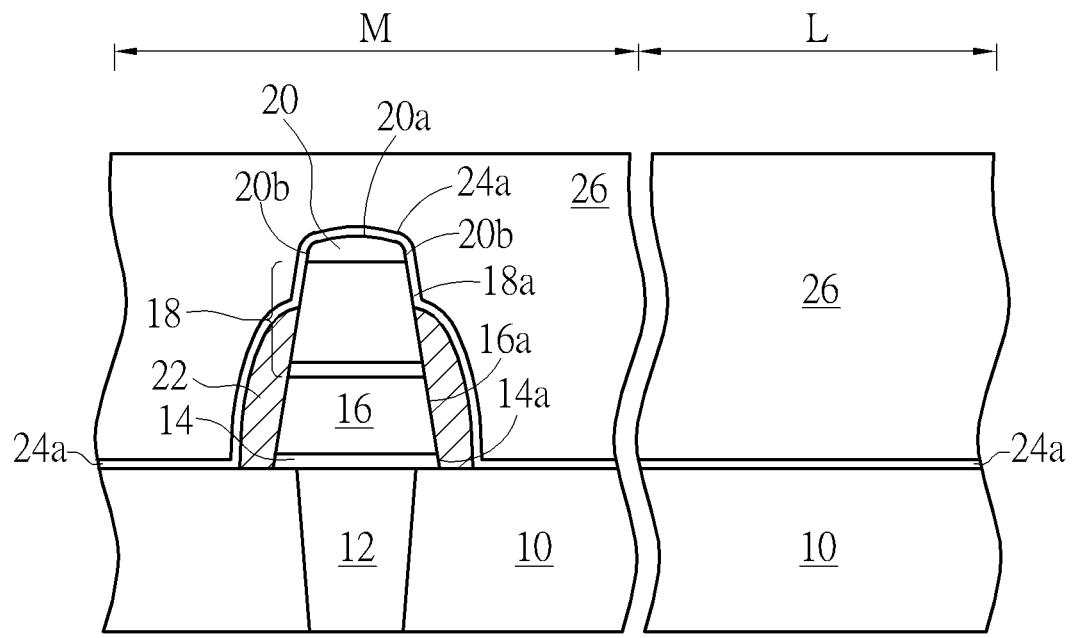
Figure 6:
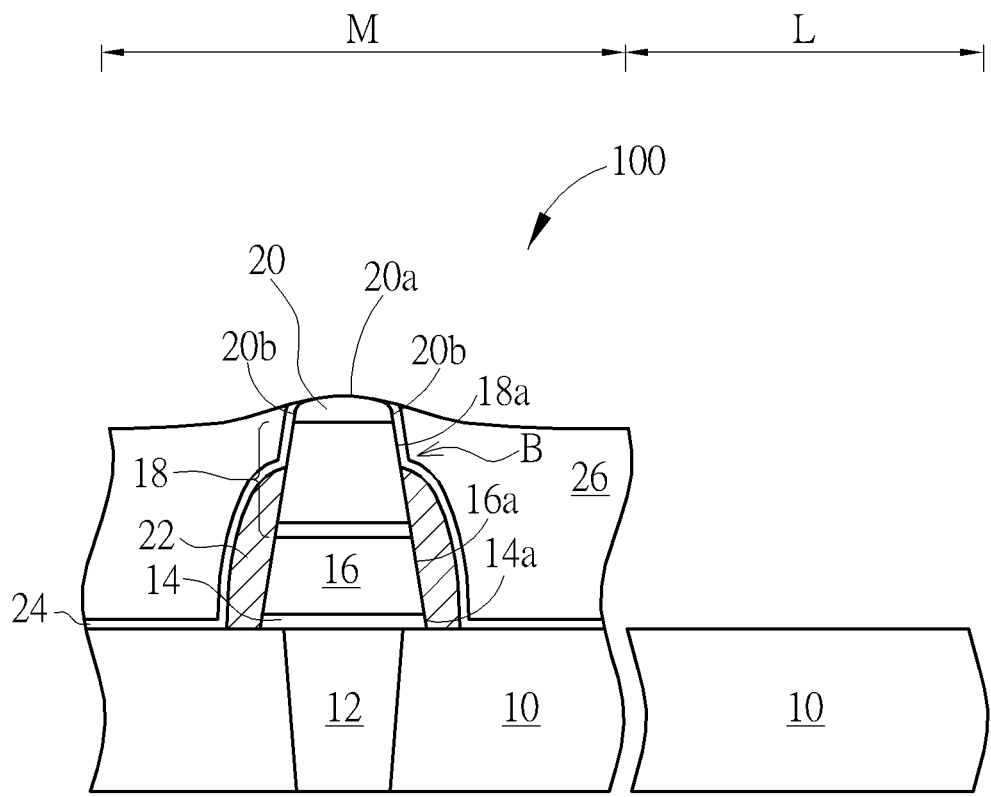

As shown in FIG. 4, a second spacer material layer 24a is formed to conformally cover the first spacer 22, contact the top electrode 18, contact the cap layer 20, and contact the substrate 10 within the memory region M and the substrate 10 within the logic device region L. The second spacer material layer 24a directly contacts the first spacer 22. As shown in FIG. 5, a dielectric layer 26 is formed to cover the second spacer material layer 24a, the substrate 10 within the memory region M and the substrate 10 within the logic device region L, wherein the dielectric layer 26 contacts the second spacer material layer 24a. The dielectric layer 26 preferably includes silicon oxide. As shown in FIG. 6, the dielectric layer 26 and the second spacer material layer 24a are etched back to completely remove the second spacer material layer 24a and the dielectric layer 26 on the top surface 20a and completely remove the second spacer material layer 24a and the dielectric layer 26 within the logic device region L. After the second spacer material layer 24a on the top surface 20a is removed, the second spacer material layer 24a is segmented. The second spacer material layer 24a form a second spacer 24 respectively located on two sides of the lower electrode 14, the resistive switching layer 16, and the top electrode 18, and the cap layer 20. The second spacer 24 is preferably silicon nitride, and the second spacer 24 needs to cover the third sidewall 18a not covered by the first spacer 22 to protect the top electrode 18 from being damaged in the subsequent process. The second spacer 24 on the first spacer 22 extends to contact the substrate 10 in the memory region M.

Now, an RRAM 100 of the present invention is completed. When etching back the dielectric layer 26 and the second spacer material layer 24a, no mask is used. By using loading effect, the dielectric layer 26 and the second spacer material layer 24a in the logic device region L are removed and the second spacer material layer 24a in the memory region M is segmented The loading effect refers to the difference in the density of device in the logic device region L and the memory region M causes different etching rate.

Figure 7:
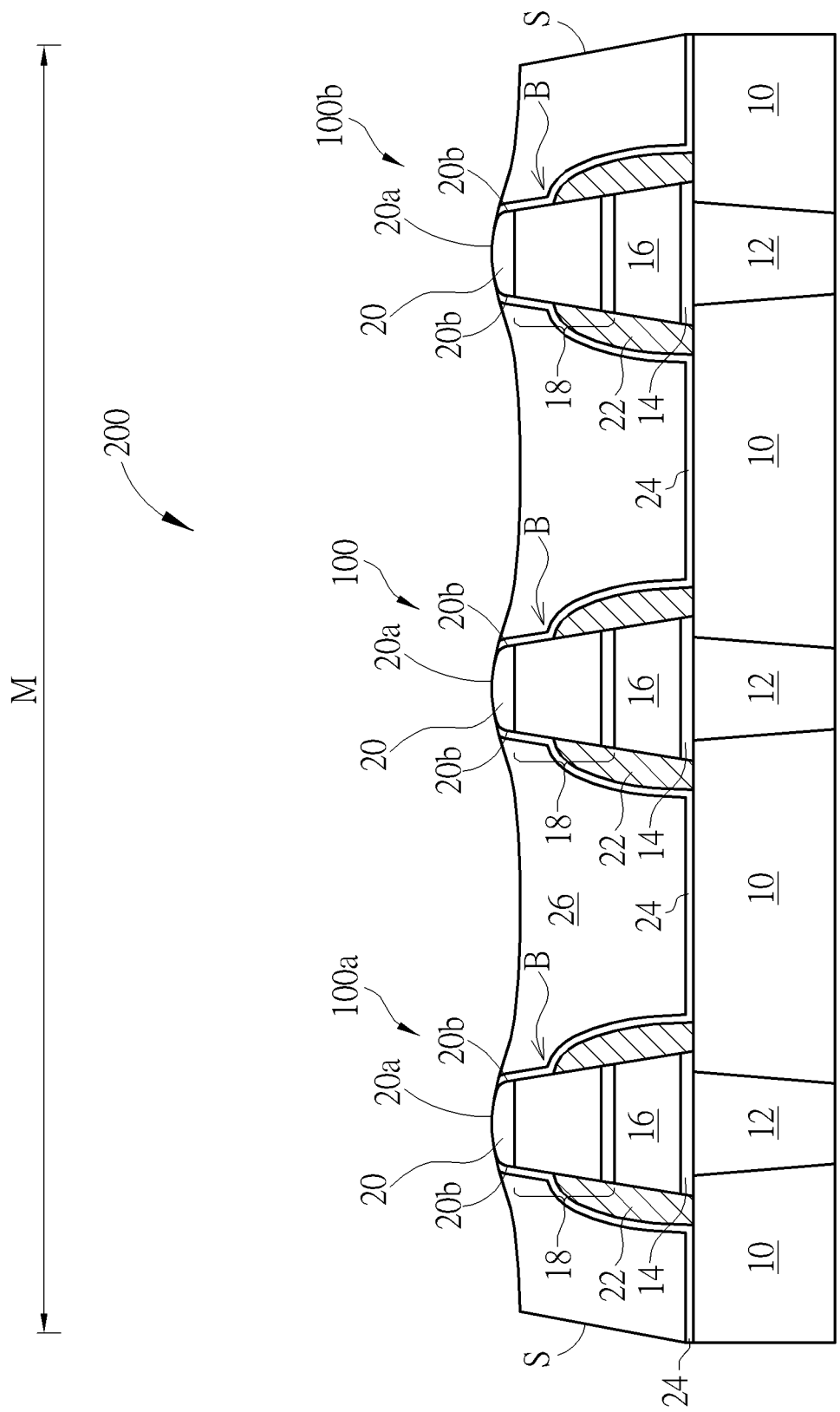
FIG. 7 depicts an RRAM string according to a preferred embodiment of the present invention.

FIG. 7 depicts an RRAM string according to another preferred embodiment of the present invention.

Please refer to FIG. 6 and FIG. 7. The RRAM 100 shown in FIG. 6 is located in the middle of the RRAM string 200. In details, there is an RRAM 100a at the left side of the RRAM 100 and an RRAM 100b at the right side of the RRAM 100. The RRAM string 200 is located in the memory area M. The structures of RRAM 100, the RRAM 100a and the RRAM 100b are the same.

The second spacer 24 on one side of the RRAM 100a extends to the substrate 10 and the second spacer 24 on one side of the RRAM 100 also extends to the substrate 10. The second spacer 24 on the RRAM 100a and the second spacer 24 on the RRAM 100 are connected on the substrate 10. Furthermore, in the RRAM string 200, the RRAM 100a and the RRAM 100b are respectively the last RRAMs in the RRAM string 200.

After the step of etching back the dielectric layer 26 and the second spacer material layer 24a as shown in FIG. 6, since the RRAM 100a and the RRAM 100b are at the last of the RRAM string 200, the dielectric layer 26 on one side of the RRAM 100a and on one side of the RRAM 100b has a slope S because of the loading effect. The end of the slope S contacts the second spacer 24 located on the surface of the substrate 10. However, because the RRAM 100 is at the middle of the memory string 200, the surface of the dielectric layer 26 on both sides of the RRAM 100 is substantially flat.

As shown in FIG. 6, according to a preferred embodiment of the present invention, an RRAM 100 includes a bottom electrode 14, a resistive switching layer 16, a top electrode 18 and a cap layer 20 stacked from bottom to top. A first spacer 22 contacts a first sidewall 14a of the bottom electrode 14, and a second sidewall 16a of the resistive switching layer 16. A second spacer 24 contacts the first spacer 22 and contacts a third sidewall 18a of the top electrode 18. The third sidewall 18a aligns with the fourth sidewalls 20a. A thickness of the first spacer 22 is greater than a thickness of the second spacer 24. The cap layer 20 includes a top surface 20a and two fourth sidewalls 20b, and an edge of the top surface 20a connects to each of the two fourth sidewalls 20b. According to a preferred embodiment of the present invention, a thickness of the first spacer 22 is between 250 angstroms and 500 angstroms, and a thickness of the second spacer 24 is between 100 angstroms and 150 angstroms. A total thickness of the first spacer 22 and the spacer 24 is between 350 angstroms and 650 angstroms. It is noteworthy that the first spacer 22 and the second spacer 24 do not cover the top surface 20a of the cap layer 20, and the first spacer 22 does not contact the fourth sidewalls 20b.

In addition, the first spacer 22 preferably extends from the second sidewall 16a to contact part of the third sidewall 18a. That is, the first spacer 22 must at least cover the second sidewall 16a of the resistive switching layer 16 completely. The second spacer 24 extends from surface of the first spacer 22 to the surface of the substrate 10. A dielectric layer 26 covers the second spacer 24 and the memory region M. The top surface 20a is exposed through the dielectric layer 26. Moreover, the dielectric layer 26, the second spacer 24, the first spacer 22, the bottom electrode 14, the resistive switching layer 16, the top electrode 18 and the cap layer 20 are not in the logic device region L.

Furthermore, an entirety of a thickness of the second spacer 24 is the same. In addition, a cross-section of the first spacer 22 includes a sail-shaped profile. The second spacer 24 contacts the third sidewall 18a and the second spacer 24 contacts a top surface of the first spacer 22 together form a bend B, and the bend B is concave toward the top electrode 18.

The substrate 10 includes a silicon substrate, a germanium substrate, a gallium arsenide substrate, a silicon germanium substrate, an indium phosphide substrate, a gallium nitride substrate, a silicon carbide substrate or a silicon-on-insulator substrate. The resistive switching layer 16 includes tantalum oxide, nickel oxide, hafnium oxide, titanium oxide or other transition metal oxides. The top electrode 18 and the bottom electrode 14 may respectively include tantalum, titanium, iridium, titanium nitride, tantalum nitride and other conductive materials. The cap layer 20 is preferably silicon oxide.

The first spacer 22 and the second spacer 24 are preferably silicon nitride. The dielectric layer 26 is silicon oxide. Since the ambient temperature during the operation of the RRAM 100 is greater than 120° C., if only the second spacer 24 is used and the first spacer 22 is not provided, when the temperature is above 120° C., oxygen atoms from the dielectric layer 26 will penetrate the second spacer 24 and enter the resistive switching layer 16, and the resistance of the RRAM 100 at the low resistance state will decrease. Therefore, in the present invention, the first spacer 22 with a larger thickness is specially added to work with the second spacer 24 to block oxygen atoms.

In addition, by using a single layer of the second spacer 24, but increasing the thickness of the second spacer 24a can also block oxygen atoms, however, problems will occur in the etching back step illustrated in FIG. 6. In details, because current etching back is only suitable for removing thin material layers such as silicon nitride smaller than 200 angstroms. If the thickness of the second spacer 24 is thickened to become more than 200 angstroms to block oxygen atoms, during the etching back, there will be second spacer material layers 24a remained in the logic device region L.

Figure 8:
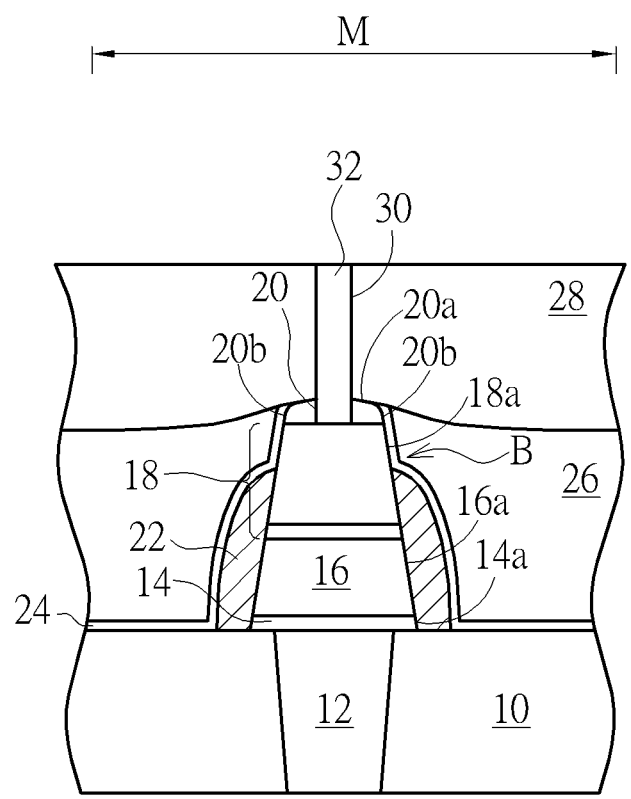
FIG. 8 depicts a fabricating method for a metal line on an RRAM according to a preferred embodiment of the present invention.

In addition, as shown in FIG. 8, after the RRAM 100 is completed, a metal interconnection process can be performed. For example, a dielectric layer 28 is formed to cover the dielectric layer 26. The dielectric layer 28 is preferably silicon oxide. Later, the dielectric layer 28 and cap layer 20 are etched to form a trench 30 within the dielectric layer 28 and the cap layer 20. Finally, metal is filled in the trench 30 to form a metal line 32. Because the second spacer material layer 24a on the top surface 20a of the cap layer 20 is removed in the etching back of FIG. 6, when forming the trench 30, only the dielectric layer 28 and the cap layer 20 need to be etched. If the second spacer material layer 24a on the top surface 20a of the cap layer 20 is not removed, an extra layer which is the second spacer material layer 24a has to be etched while forming the trench 30. However, the second spacer material layer 24a is silicon nitride. Because the etching conditions for forming the trench 30 are more suitable for etching silicon oxide, the second spacer material layer 24a will be etched incompletely. In the present invention, the problem of incomplete formation of the trench 30 is avoided by removing the second spacer material layer 24a on the top surface 20a in advance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) comprising:
    a bottom electrode, a resistive switching layer, a top electrode and a cap layer stacked from bottom to top, wherein the cap layer comprises a top surface and two fourth sidewalls, and an edge of the top surface connects to each of the two fourth sidewalls;
    a first spacer contacting a first sidewall of the bottom electrode, and a second sidewall of the resistive switching layer; and
    a second spacer contacting the first spacer and contacting a third sidewall of the top electrode, wherein a thickness of the first spacer is greater than a thickness of the second spacer and the first spacer and the second spacer do not cover the top surface of the cap layer.

2. The RRAM of claim 1, wherein the first spacer contacts part of the third sidewall of the top electrode.

3. The RRAM of claim 1, wherein an entirety of a thickness of the second spacer is the same.

4. The RRAM of claim 1, wherein the second spacer contacting the third sidewall and the second spacer contacting a top surface of the first spacer together form a bend, and the bend is concave toward the top electrode.

5. The RRAM of claim 1, further comprising:
    a substrate comprising a memory region and a logic device region, wherein the second spacer on the first spacer extends to a surface of the substrate;
    a conductive line embedded within the memory region, and the conductive line contacting the bottom electrode; and
    a dielectric layer covering the second spacer and the memory region, wherein the top surface of the cap layer is exposed through the dielectric layer.

6. The RRAM of claim 5, wherein the dielectric layer and the second spacer are not within in the logic device region.

7. The RRAM of claim 1, wherein a thickness of the first spacer is between 250 angstroms and 500 angstroms, and a thickness of the second spacer is between 100 angstroms and 150 angstroms.

8. The RRAM of claim 1, wherein a cross-section of the first spacer comprises a sail-shaped profile.

9. The RRAM of claim 1, wherein the resistive switching layer comprises tantalum oxide, titanium oxide or hafnium oxide.

10. A fabricating method of a resistive random access memory (RRAM), comprising:
    forming a bottom electrode, a resistive switching layer, a top electrode and a cap layer stacked from bottom to top, wherein the cap layer comprises a top surface and two fourth sidewalls, and an edge of the top surface connects to each of the two fourth sidewalls;
    forming a first spacer contacting a first sidewall of the bottom electrode, and a second sidewall of the resistive switching layer; and
    forming a second spacer contacting the first spacer and contacting a third sidewall of the top electrode, wherein a thickness of the first spacer is greater than a thickness of the second spacer and the first spacer and the second spacer do not cover the top surface of the cap layer.

11. The fabricating method of an RRAM of claim 10, further comprising:
    forming a substrate comprising a memory region and a logic device region, wherein the bottom electrode, the resistive switching layer, the top electrode and the cap layer are stacked within the memory region on the substrate;
    after forming the cap layer, forming a first spacer material layer to cover the bottom electrode, the resistive switching layer, the top electrode, the cap layer and the substrate;
    etching the first spacer material layer to remove the first spacer material layer on the top surface of the cap layer to form the first spacer;
    after forming the first spacer, forming a second spacer material layer to cover the first spacer and to contact the top electrode, the cap layer and the substrate;
    forming a dielectric layer covering the second spacer material layer; and
    etching the dielectric layer and the second spacer material layer to remove the second spacer material layer and the dielectric layer on the top surface of the cap layer to form the second spacer.

12. The fabricating method of an RRAM of claim 11, further comprising:
    when forming the second spacer material layer to cover the first spacer, the second spacer material layer covering the logic device region;
    when forming the dielectric layer to cover the second spacer material layer, the dielectric layer covering the logic device region; and when etching the dielectric layer and the second spacer material layer, removing the second spacer material layer and the dielectric layer in the logic device region completely.

13. The fabricating method of an RRAM of claim 10, wherein the first spacer contacts part of the third sidewall of the top electrode.

14. The fabricating method of an RRAM of claim 10, wherein an entirety of a thickness of the second spacer is the same.

15. The fabricating method of an RRAM of claim 10, wherein the second spacer contacting the third sidewall and the second spacer contacting a top surface of the first spacer together form a bend, and the bend is concave toward the top electrode.

16. The fabricating method of an RRAM of claim 10, wherein a thickness of the first spacer is between 250 angstroms and 500 angstroms, and a thickness of the second spacer is between 100 angstroms and 150 angstroms.

17. The fabricating method of an RRAM of claim 10, wherein a cross-section of the first spacer comprises a sail-shaped profile.

18. The fabricating method of an RRAM of claim 10, wherein the resistive switching layer comprises tantalum oxide, titanium oxide or hafnium oxide.

\* \* \* \* \*